(12) United States Patent
Shin et al.

(10) Patent No.: US 7,160,810 B2
(45) Date of Patent: Jan. 9, 2007

(54) METHOD FOR FORMING INTERLAYER INSULATION FILM IN SEMICONDUCTOR DEVICE

(75) Inventors: Kang Sup Shin, Cheongju-Shi (KR); Sang Wook Ryu, Cheongju-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 211 days.

(21) Appl. No.: 10/878,317

(22) Filed: Jun. 29, 2004

(65) Prior Publication Data

US 2005/0142848 A1    Jun. 30, 2005

(30) Foreign Application Priority Data

Dec. 24, 2003    (KR)    ............ 10-2003-0096236

(51) Int. Cl.
*H01L 21/311*    (2006.01)

(52) U.S. Cl. .............. 438/695; 438/653; 438/637

(58) Field of Classification Search ........... 438/695, 438/696, 700, 710, 725, 627, 637, 643, 653
See application file for complete search history.

(56) References Cited

U.S. PATENT DOCUMENTS 6,492,276 B1 *   12/2002   Huang ................... 438/700
6,844,266 B1 *   1/2005    Maex et al. ............ 438/714

* cited by examiner

*Primary Examiner*—Kevin M. Picardat
(74) *Attorney, Agent, or Firm*—Mayer Brown Rowe & Maw LLP

(57) ABSTRACT

The present invention discloses a method for forming an interlayer insulation film in a semiconductor device, comprising the steps of: sequentially forming a porous low dielectric insulation film and a capping layer on the semiconductor substrate on which a few elements of the semiconductor device have been formed; and forming damascene patterns in the porous low dielectric insulation film by an etching process, and forming a protection film for closing pores exposed during the etching process at the same time.

19 Claims, 2 Drawing Sheets

METHOD FOR FORMING INTERLAYER INSULATION FILM IN SEMICONDUCTOR DEVICE

BACKGROUND

1. Field of the Invention

The present invention relates to a method for forming an interlayer insulation film in a semiconductor device, and more particularly to, a method for forming an interlayer insulation film in a semiconductor device by using a porous low dielectric insulation film including air having the lowest dielectric constant in the form of pores.

2. Discussion of Related Art

The ultimate objects of the semiconductor manufacturing technology are high integration and high performance of a semiconductor device. The most important factor for attaining the high integration and high performance is a copper wiring process. Because a copper line is rarely etched by a general etching material, an inlaying method for filling and planarizing copper after etching an interlayer insulation film has been used.

In addition, when low resistance characteristics of the copper line are not satisfactory, the copper line is combined with a low dielectric to reduce an RC delay, thereby manufacturing a high performance semiconductor device. A few kinds of materials have a low-dielectric constant. Recently, an organo silicate glass (OSG) has been generally developed. Here, silicon-oxygen-methane (or carbon) bonding partially exists in or coexists with silicon-oxygen bonding, to reduce the dielectric constant to 2.2 band. In case micropores are additionally formed in an interlayer insulation film, the dielectric constant can be more lowered. However, if porosity of the interlayer insulation film increases, pores are possibly coupled to form open pores. Such open pores form diffusion paths of metal ions, to facilitate metal diffusion. Moreover, when a high pressure is applied to the interlayer insulation film during a succeeding process for forming a metal barrier layer or a metal seed layer, the interlayer insulation film may be destroyed or collapsed. In addition, when the metal ions are diffused through the open pores, adjacent metal lines are shorted or leakage current is increased. As a result, electrical properties of the device are deteriorated or defects are generated.

SUMMARY OF THE INVENTION

The present invention is directed to a method for forming an interlayer insulation film in a semiconductor device which can improve reliability of the process and electrical properties of the device, by preventing reaction gases of an organic metal source from being adsorbed between pores or metal elements from being diffused through the pores, by forming a porous low dielectric insulation film including air having the lowest dielectric constant in the form of pores, forming contact holes and trenches on the porous low dielectric insulation film according to a dual damascene process, and forming a protection film on the surface of the porous low dielectric insulation film to completely close the pores exposed to the sidewalls and the bottom surfaces of the contact holes and the trenches.

One aspect of the present invention is to provide a A method for forming an interlayer insulation film in a semiconductor device, comprising the steps of: sequentially forming a porous low dielectric insulation film and a capping layer on the semiconductor substrate on which a few elements of the semiconductor device have been formed; and forming damascene patterns in the porous low dielectric insulation film by an etching process, and forming a protection film for closing pores exposed during the etching process at the same time.

Here, the interlayer insulation film is formed by using a porous OSG, and the capping layer is formed by using polysilicon, $SiO_2$, SiN, SiC or SiON, or a stacked structure thereof.

The protection film is formed by using nonvolatile polymers, an additive gas containing HBr gas and $O_2$ gas and CxHyFz gas are used at the same time to form the protection film during the etching process, a supply flow of HBr gas is set between 5 sccm and 1000 sccm, and a supply flow of $O_2$ gas is set between 1 sccm and 100 sccm.

On the other hand, a select ratio of the porous low dielectric insulation film to the other materials is controlled in the etching process by controlling a ratio of x to y and z in CxHyFz. That is, the select ratio of the materials excluding the porous low dielectric insulation film is increased by increasing the ratio of x to y and z, and decreased by decreasing the ratio of x to y and z.

$N_2$, Ar or He gas is further supplied as the additive gas. Here, the select ratio of the materials excluding the porous low dielectric insulation film is increased by decreasing an addition ratio of the additive gas, and decreased by increasing the addition ratio of the additive gas.

DETAILED DESCRIPTION OF PREFERRED EMBODIMENTS

Figure 1A:
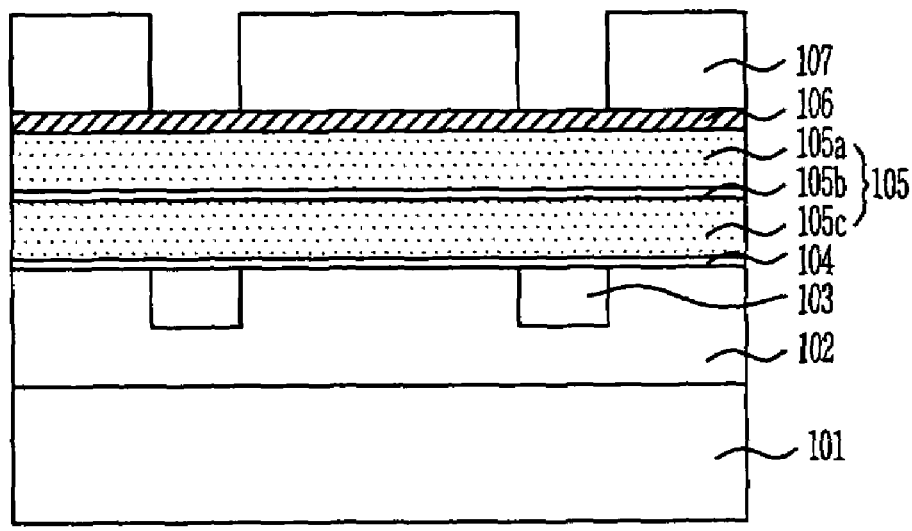
FIGS. 1A to 1D are cross-sectional diagrams illustrating sequential steps of a method for forming an interlayer insulation film in a semiconductor device in accordance with a preferred embodiment of the present invention.

A method for forming an interlayer insulation film in a semiconductor device in accordance with a preferred embodiment of the present invention will now be described in detail with reference to the accompanying drawings.

In the case that it is described that one film is disposed 'on' another film or a semiconductor substrate, one film can directly contact another film or the semiconductor substrate, or the third film can be positioned between them. In the drawings, a thickness or size of each layer is exaggerated to provide clear and accurate explanations. Wherever possible, the same reference numerals will be used throughout the drawings and the description to refer to the same or like parts.

FIGS. 1A to 1D are cross-sectional diagrams illustrating sequential steps of the method for forming the interlayer insulation film in the semiconductor device in accordance with the preferred embodiment of the present invention.

Referring to FIG. 1A, a semiconductor substrate 101 on which a few elements for forming the semiconductor device have been formed is provided. For example, transistors or memory cells (not shown) can be formed on the semiconductor substrate 101. A lower interlayer insulation film 102 is formed on the semiconductor substrate 101, dual damascene patterns (not shown) composed of contact holes and trenches are formed on the lower interlayer insulation film 102 according to a dual damascene process, and a conductive material is filled in the dual damascene patterns, thereby forming lower metal lines 103. Here, the lower metal lines 103 can be formed by using copper. On the other hand, a metal barrier layer (not shown) can be formed on the lower metal lines 103 and the lower interlayer insulation film 102 in order to prevent metal elements of the lower metal lines 103 from being diffused into the lower interlayer insulation film 102.

Thereafter, a diffusion barrier film 104 and an upper interlayer insulation film 105 are formed over the resulting structure. Preferably, the diffusion barrier film 104 is formed at a thickness of 100 Å to 1000 Å, by using a material for controlling an etching select ratio to the upper interlayer insulation film 105 by controlling a C/F ratio, such as SiC, SiN($Si_3N_4$), SIOC, SiOCH or SiON. Here, the upper interlayer insulation film 105 has a stacked structure of a first insulation film 105a, an etch barrier film 105b and a second insulation film 105c. The first and second insulation films 105a and 105c are formed by using a porous OSG containing SiOC($CH_3$). The etch barrier film 105b is formed by using SiC, SiN or SiON. The upper interlayer insulation film 105 can be formed at a thickness of 1000 Å to 15000 Å.

A capping layer 106 is formed on the upper interlayer insulation film 105, and via hole photoresist patterns 107 in which presumed damascene pattern regions such as via holes or trenches have been defined are formed on the capping layer 106. Here, the capping layer 106 is formed at a thickness of 50 Å to 3000 Å, by using polysilicon, $SiO_2$, SiN, SiC or SiON, or a stacked structure thereof.

Figure 1B:
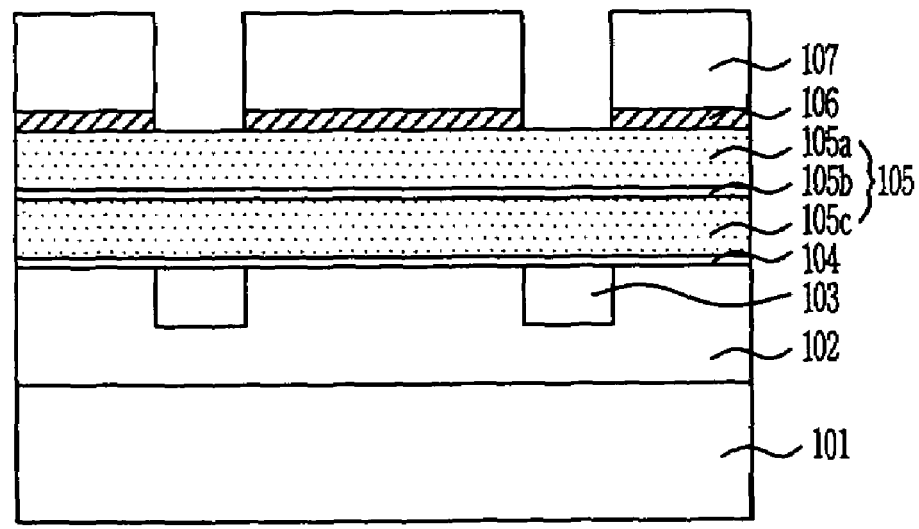

As illustrated in FIG. 1B, the capping layer 106 is etched in the presumed damascene pattern regions. Here, the capping layer 106 can be etched by using $Cl_2$ or HBr as an etching gas and $O_2$, $N_2$, He or Ar as an additive gas.

Figure 1C:
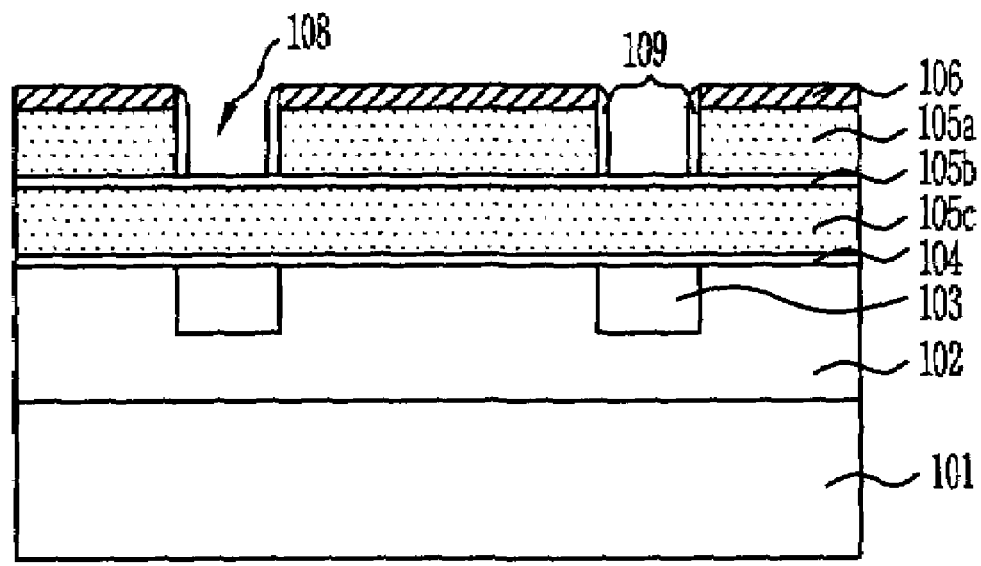

As shown in FIG. 1C, damascene patterns 108 are formed by etching the upper interlayer insulation film 105 according to an etching process. When the damascene patterns 108 are trenches as shown in FIG. 1C, the second insulation film 105c is etched, but the first insulation film 105a is not etched by the etch barrier film 105b. When the damascene patterns 108 are via holes, the second insulation film 105c, the etch barrier film 105b and the first insulation film 105 are sequentially etched.

When the etching process is a dry etching process, CxHyFz gas (x, y and z are 0 or natural numbers) is used as a main etching gas, and $O_2$, $N_2$, Ar or He gas is used as an additive gas. A select ratio can be controlled by adjusting a composition ratio of the CxHyFz gas or an addition ratio of the additive gas.

That is, when a ratio of x to y and z is increased, the C/F ratio is increased to raise the select ratio to the diffusion barrier film 104. Similar effects can be obtained by decreasing the addition ratio of $O_2$ or $N_2$.

Conversely, when the ratio of x to y and z is decreased or the addition ratio of $O_2$ or $N_2$ is increased, the C/F ratio is decreased to lower the select ratio to the diffusion barrier film 104.

When both the composition ratio of the etching gas and the mixing ratio of the additive gas are controlled, the insulation film is not left after the etching process, and over-etching is prevented.

On the other hand, a protection film 109 is formed to close pores (not shown) exposed to the sidewalls of the damascene patterns 108 in the etching process. The protection film 109 is formed by additionally supplying an additive gas. For example, when HBr gas and $O_2$ gas are added as the additive gas, nonvolatile polymers containing Si-Br from polysilicon elements of the capping layer 106 having a loss are deposited on the sidewalls of the damascene patterns 108, thereby forming the protection film 109 containing the polymers.

Preferably, a supply flow of HBr gas is set between 5 sccm and 1000 sccm, and a supply flow of $O_2$ gas is set between 1 sccm and 100 sccm.

Accordingly, when the damascene patterns 108 are formed, the protection film 109 for preventing exposure of the pores can be formed.

Figure 1D:
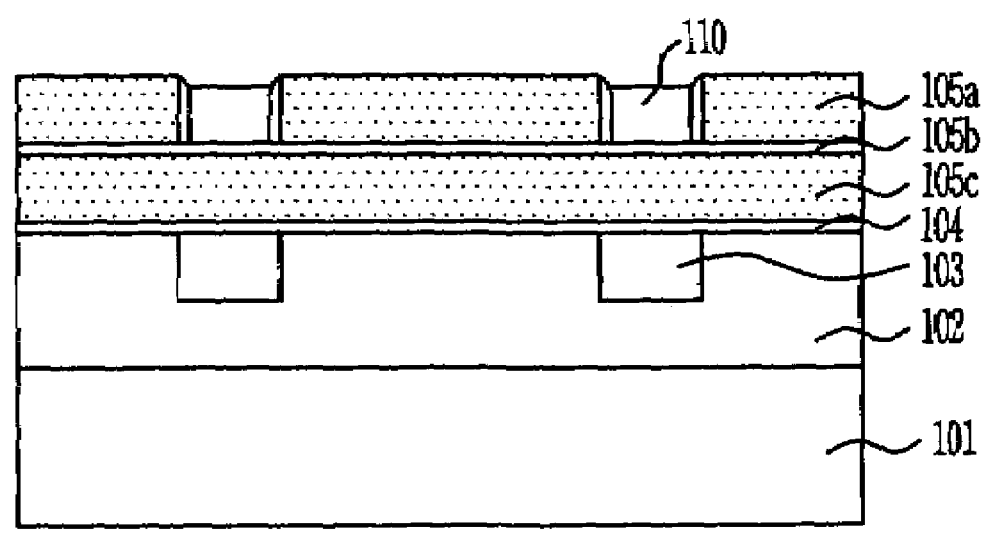

As depicted in FIG. 1D, upper metal lines 110 are formed inside the damascene patterns 109. The upper metal lines 110 can be formed by performing the steps of forming a metal barrier layer, forming a metal seed layer and performing an electroplating process. On the other hand, the protection film 109 prevents metal ions of the metal lines 110 from being diffused.

As discussed earlier, in accordance with the present invention, the method for forming the interlayer insulation film in the semiconductor device can improve reliability of the process and electrical properties of the device, by preventing the reaction gases of the organic metal source from being adsorbed between the pores or the metal elements from being diffused through the pores, by forming the porous low dielectric insulation film including air having the lowest dielectric constant in the form of pores, forming the contact holes and the trenches on the porous low dielectric insulation film according to the dual damascene process, and forming the protection film on the surface of the porous low dielectric insulation film to completely close the pores exposed to the sidewalls and the bottom surfaces of the contact holes and the trenches.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method for forming an interlayer insulation film in a semiconductor device, comprising the steps of:
   forming a diffusion barrier film on a lower interlayer insulation film and metal lines;
   sequentially forming an upper interlayer insulation film and a capping layer on the diffusion barrier film; and
   forming damascene patterns in the upper interlayer insulation film by an etching process, and forming a protection film for closing pores exposed during the etching process at the same time.

2. The method of claim 1, wherein the upper interlayer insulation film is formed with using a porous organo silicate glass.

3. The method of claim 1, wherein the capping layer is formed with polysilicon, $SiO_2$, SiN, SiC or SiON, or a stacked structure thereof.

4. The method of claim 1, wherein the protection film is formed with nonvolatile polymers.

5. The method of claim 4, wherein an additive gas containing HBr gas and $O_2$ gas and CxHyFz gas are used at the same time to form the protection film during the etching process.

6. The method of claim 5, wherein a supply flow of HBr gas ranges from 5 sccm to 1000 sccm, and a supply flow of $0_2$ gas ranges from 1 sccm to 100 sccm.

7. The method of claim 5, wherein a select ratio of the upper interlayer insulation film to the other materials is controlled by controlling a ratio of x to y and z in CxHyFz.

8. The method of claim 7, wherein the select ratio of the materials excluding upper interlayer insulation film is increased by increasing the ratio of x to y and z, and decreased by decreasing the ratio of x to y and z.

9. The method of claim 5, wherein $N_2$, Ar or He gas is further supplied as the additive gas.

10. The method of claim 5, wherein the select ratio of the materials excluding the upper interlayer insulation film is increased by decreasing an addition ratio of the additive gas, and decreased by increasing the addition ratio of the additive gas.

11. A method for forming an interlayer insulation film in a semiconductor device, comprising the steps of:
    forming a lower interlayer insulation film on the semiconductor substrate on which a few elements of the semiconductor device have been formed;
    forming damascene patterns in the lower interlayer insulation film using a dual damascene process;
    forming a lower metal line by filling a conductive material in the damascene patterns, thereby forming a resulting structure;
    forming a diffusion barrier layer on the resulting structure;
    forming an upper interlayer insulation film on the diffusion barrier layer;
    forming a capping layer on the upper interlayer insulation film;
    performing an etching process to form a trench or via hall by etching the capping layer and the upper interlayer insulation film and to form a protective film on a sidewall of the trench or via hall; and
    forming a upper metal line in the trench or via hail.

12. The method of claim 11, wherein the protection film is formed with nonvolatile polymers.

13. The method of claim 12, wherein an additive gas containing HBr gas and $O_2$ gas and $C_xH_yF_z$ gas are used at the same time to form the protection film during the etching process.

14. The method of claim 13, wherein a supply flow of HBr gas ranges from 5 sccm to 1000 sccm, and a supply flow of $O_2$ gas ranges from 1 sccm to 100 sccm.

15. The method of claim 13, wherein a select ratio of the upper interlayer insulation film to the other materials is controlled by controlling a ratio of x to y and z in $C_xH_yF_z$.

16. The method of claim 15, wherein the select ratio of the materials excluding the upper interlayer insulation film is increased by increasing the ratio of x to y and z, and decreased by decreasing the ratio of x to y and z.

17. The method of claim 13, wherein $N_2$, Ar or He gas is further supplied as the additive gas.

18. The method of claim 13, wherein the select ratio of the materials excluding the upper interlayer insulation film is increased by decreasing an addition ratio of the additive gas, and decreased by increasing the addition ratio of the additive gas.

19. The method of claim 11, wherein the upper interlayer insulation film includes a first insulation film, an etch barrier film on the first insulation film and a second insulation film on the etch barrier film.

* * * * *